United States Patent
Nakagame et al.

(10) Patent No.: US 8,980,374 B2
(45) Date of Patent: Mar. 17, 2015

(54) METHOD FOR PRODUCING FUNCTIONAL FILM

(75) Inventors: Masami Nakagame, Odawara (JP);
Hiroyuki Nishida, Odawara (JP);
Norihiro Kadota, Odawara (JP); Jun Fujinawa, Odawara (JP); Daisuke Onodera, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 1029 days.

(21) Appl. No.: 12/363,348

(22) Filed: Jan. 30, 2009

(65) Prior Publication Data

US 2009/0196997 A1    Aug. 6, 2009

(30) Foreign Application Priority Data

Jan. 31, 2008    (JP) .................. 2008-020386

(51) Int. Cl.
| | | |
|---|---|---|
| B05D 3/00 | (2006.01) | |
| C23C 16/54 | (2006.01) | |
| B05D 1/28 | (2006.01) | |
| B05D 7/04 | (2006.01) | |
| C23C 14/56 | (2006.01) | |
| B05D 3/06 | (2006.01) | |
| B05D 7/00 | (2006.01) | |

(52) U.S. Cl.
CPC ............ *C23C 16/545* (2013.01); *B05D 1/28* (2013.01); *B05D 7/04* (2013.01); *C23C 14/562* (2013.01); *B05D 3/067* (2013.01); *B05D 7/54* (2013.01); *B05D 2252/02* (2013.01)
USPC ...................................... 427/294

(58) Field of Classification Search
CPC ............. B05D 1/28; B05D 1/60; B05D 1/62; B05D 7/04; C23C 14/56; C23C 16/545
USPC ................................. 427/209, 294
See application file for complete search history.

(56) References Cited

U.S. PATENT DOCUMENTS

| | | | | |
|---|---|---|---|---|
| 5,436,035 | A | * | 7/1995 | Lohwasser .................. 427/525 |
| 5,725,909 | A | | 3/1998 | Shaw et al. |
| 6,706,412 | B2 | * | 3/2004 | Yializis .................... 428/463 |
| 7,157,117 | B2 | * | 1/2007 | Mikhael et al. ........... 427/255.6 |
| 2004/0213918 | A1 | | 10/2004 | Mikhael et al. |

(Continued)

FOREIGN PATENT DOCUMENTS

| | | |
|---|---|---|
| JP | 08512256 A | 12/1996 |
| JP | 2001-353805 A | 12/2001 |

(Continued)

OTHER PUBLICATIONS

EP Communication, dated Jun. 5, 2009, issued in corresponding EP Application No. 09001303.8, 7 pages.

(Continued)

*Primary Examiner* — Michael Wieczorek
(74) *Attorney, Agent, or Firm* — Sughrue Mion, PLLC

(57) ABSTRACT

A functional film having a particular organic film and a particular inorganic film is produced. The functional film is consistently produced and exhibits the intended performance. The functional film production method includes forming an organic film on a surface of a substrate, handling the substrate having the organic film formed thereon so that no member comes in contact with an organic film surface in vacuum until formation of an inorganic film, and forming the inorganic film by vacuum deposition on the organic film surface.

9 Claims, 2 Drawing Sheets

(56) References Cited

U.S. PATENT DOCUMENTS

2006/0159844 A1* 7/2006 Moriwaki et al. ............ 427/127
2007/0166528 A1* 7/2007 Barnes et al. ............ 428/304.4

FOREIGN PATENT DOCUMENTS

| JP | 2002205354 A | 7/2002 |
| JP | 2002-264274 A | 9/2002 |

OTHER PUBLICATIONS

Japanese Office Action issued in Japanese Patent Application No. 2008-020386 dated Dec. 20, 2011.
Notification of Reasons for Refusal, dated Nov. 6, 2012, issued in corresponding JP Application No. 2008-020386, 9 pages in English and Japanese.

* cited by examiner

METHOD FOR PRODUCING FUNCTIONAL FILM

The entire contents of literatures cited in this specification are incorporated herein by reference.

BACKGROUND OF THE INVENTION

This invention relates to a method for producing a functional film. More specifically, this invention relates to a method for producing a functional film having an organic film comprising a particular polymer and an inorganic film.

Various functional films (functional sheets) including gas barrier films, protective films, and optical films such as optical filters and antireflection films are used in various devices including optical devices, display devices such as liquid crystal displays and organic EL displays, semiconductor devices, and thin film solar batteries.

The functional films have been formed by film formation (thin film formation) through vacuum deposition techniques such as sputtering and plasma CVD.

Continuous deposition of a film on a long strip of substrate is preferable for efficient film formation with high productivity.

A typical device known in the art for conducting such film formation is a roll-to-roll film formation device using a feed roll having a long strip of substrate (a web of substrate) wound into a roll and a take-up roll in which the substrate having a film formed thereon is wound into a roll. This roll-to-roll film formation device continuously forms a film on a long strip of substrate in the film formation chamber while conveying the substrate from the feed roll to the take-up roll along a predetermined pathway passing through the film formation chamber where the film is formed on the substrate by plasma CVD. In this device, the substrate is fed from the feed roll in synchronism with the winding of the substrate having the film formed thereon on the take-up roll.

By the way, a functional film such as a gas barrier film or a protective film is not always a mono-layer film, and a typical functional film known in the art is the one prepared by forming an organic film containing a polymer as its main component on a substrate such as a plastic film, and thereafter forming an inorganic film comprising an inorganic compound on the organic film.

For example, JP 2002-264274 A discloses a gas barrier film prepared by forming an organic film comprising a cured composition containing a monomer or an oligomer of a hexafunctional acrylate or methacrylate, and an inorganic film comprising an oxide selected from aluminum oxide, silicon oxide, a complex oxide of indium and tin, and a complex oxide of indium and cerium.

SUMMARY OF THE INVENTION

In the roll-to-roll film formation device as described above, a conveyor means such as a pair of conveyor rollers (nip rollers) are usually provided for adequately conveying the substrate along a predetermined pathway.

However, in the production of a functional film in which an inorganic film is deposited after forming an organic film of some particular type, the functional film exhibiting the desired performance such as sufficient gas barrier properties may become difficult to produce due to the loss of the performance or the properties of the organic film when a conventional type of the conveyor means such as a pair of conveyor rollers is used for the handling of the substrate.

The present invention has been made to solve the problems as described above, and an object of the present invention is to provide a method for producing a functional film, wherein an organic film containing a polymer as its main component is formed followed by the deposition of an inorganic film, and wherein the loss of the performance or properties of the organic film during the production is prevented to enable production of a high quality functional film in a consistent manner.

In order to realize the object as described above, the present invention provides a method for producing a functional film comprising the steps of forming an organic film on a surface of a substrate; handling the substrate having the organic film formed on the surface of the substrate so that no member comes in contact with an organic film surface in vacuum until formation of an inorganic film; and forming the inorganic film by vacuum deposition on the organic film surface to produce the functional film.

The inorganic film formed preferably has gas barrier properties.

The handling step of the substrate preferably comprises a step of conveying the substrate.

Preferably, the organic film and the inorganic film are formed on a long strip of the substrate, the inorganic film is formed on the organic film surface while the substrate having the organic film formed on the surface of the substrate is guided on a drum and conveyed in its longitudinal direction, and a vacuum chamber used for forming the inorganic film is not provided, upstream from a region where the inorganic film is formed, a member coming in contact with the organic film surface.

Preferably, a long strip of the substrate is conveyed along a predetermined pathway on which a means for forming the organic film and a means for forming the inorganic film are provided, and the organic film and the inorganic film are formed while the substrate is conveyed in its longitudinal direction.

Preferably, a long strip of the substrate having the organic film formed on the surface of the substrate after film deposition is wound into a roll, then fed from the roll to a vacuum chamber for forming the inorganic film, where the inorganic film is formed while the substrate is conveyed in its longitudinal direction.

In the present invention as summarized above, an organic film containing a polymer as its main component such as an organic film containing a polymer produced by polymerizing an acrylate monomer and/or a methacrylate monomer as its main component is formed on a substrate, and an inorganic film is thereafter formed to produce a functional film, and in the production, the substrate having the organic film formed thereon is conveyed (handled) so that the surface of the organic film does not come in contact with anything in vacuum before the formation of the inorganic film.

The production method of the present invention as summarized above is capable of preventing the properties and performance of the organic film from being deteriorated by the handling such as conveying of the film by a pair of conveyor rollers so that a highly functional film properly having the intended performance and properties can be consistently produced.

DETAILED DESCRIPTION OF THE INVENTION

Next, the method for producing a functional film according to the present invention is described in detail by referring to the preferred embodiments shown in the accompanying drawings.

Figure 1:
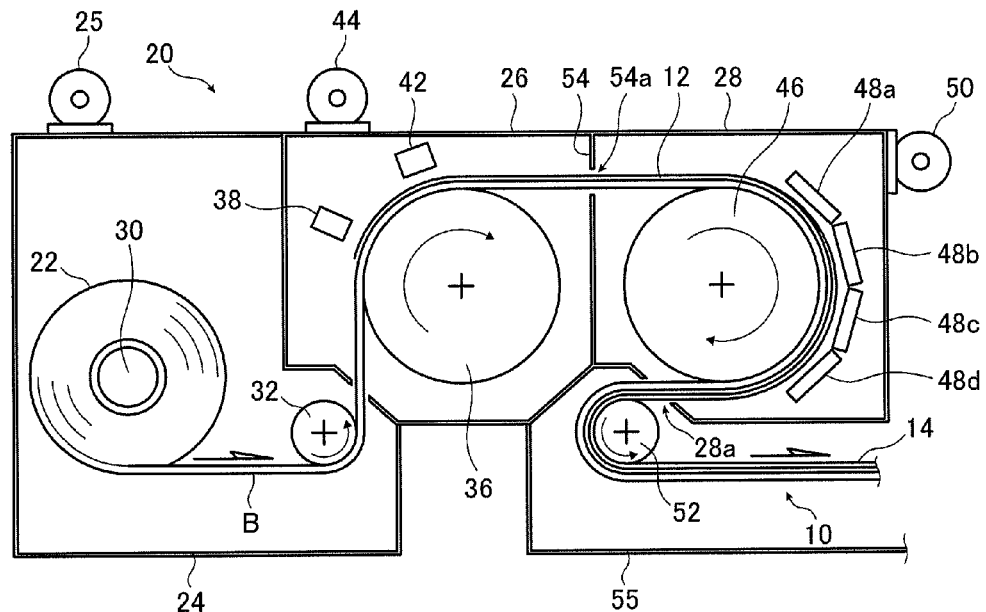
FIG. 1 is a schematic view showing an embodiment of the production device for implementing the functional film production method of the present invention.

FIG. 1 is a schematic view showing an embodiment of the device used for producing a functional film where the method for producing the functional film according to the present invention is carried out.

FIG. 1 shows a device 20 for producing a functional film (hereinafter referred to as the "production device" 20). In this device 20, an organic film 12 containing a predetermined polymer as its main component is formed on a surface of a substrate B which is in the form of a long film strip (the starting film material), and an inorganic film 14 is formed on the organic film 12 by vacuum deposition to thereby produce a functional film 10.

The production device 20 used for producing such functional film 10 is a device in which the film formation is conducted by the so-called "roll to roll" system. In this device, the substrate B in the form of a long film strip is fed from a substrate roll 22, and the substrate is conveyed in its longitudinal direction while the organic film 12 and the inorganic film 14 are formed on the substrate to thereby produce the functional film 10. The functional film 10 is then wound on a take-up roll. The production device 20 basically includes a substrate feeding chamber 24, an organic film forming chamber 26, an inorganic film forming chamber 28, and a take-up chamber (not shown) where the thus produced functional film 10 is wound into a roll.

In the production device 20, the substrate roll 22 having the substrate B in the form of a long film strip is mounted on a rotary shaft 30 in the substrate feeding chamber 24 as described above.

Once the substrate roll 22 is mounted on the rotary shaft 30, the substrate B is conveyed along a predetermined pathway along which the substrate B travels from the substrate feeding chamber 24 through the organic film forming chamber 26 and the inorganic film forming chamber 28 to the winding shaft (not shown) in the take-up chamber. In the production device 20, the feed of the substrate B from the substrate roll 22 and the winding of the functional film 10 on the winding shaft are carried out in synchronism so that the substrate B in the form of a long film strip is conveyed in its longitudinal direction along the predetermined pathway while the continuous formation of the organic film 12 on the substrate B and the continuous formation of the inorganic film 14 on the organic film 12 are carried out.

In the substrate feeding chamber 24, the rotary shaft 30 is rotated by a power source (not shown) in a counterclockwise direction in FIG. 1 so that the substrate B is fed from the substrate roll 22 and conveyed by a guide roller 32 along the predetermined pathway to the organic film forming chamber 26.

In addition to such guide roller 32, members for conveying the substrate B along the predetermined pathway such as a pair of conveyor rollers or a guide member may be provided in the substrate feeding chamber 24.

The substrate feeding chamber 24 is a vacuum chamber which is evacuated to a predetermined pressure (predetermined degree of vacuum) by a vacuum evacuation means 25. In the production device 20, this prevents the pressure of the substrate feeding chamber 24 from adversely affecting the formation of the organic film (flash evaporation) carried out in the organic film forming chamber 26 to be described later.

In the present invention, the substrate B on which the organic film 12 and the inorganic film 14 are formed is not particularly limited, and any substrate (base film) used in preparing various functional films such as gas barrier films, optical films, and protective films may be used as long as formation of the organic film 12 and formation of the inorganic film 14 by vacuum deposition to be described later are possible. Examples of such substrate include resin films such as PET films and metal sheets such as aluminum sheets.

The substrate B used may be the one having a film such as a protective film or an adhesive film formed on its surface.

The organic film forming chamber 26 is a chamber in which the organic film (organic layer) 12 containing a polymer as its main component is formed on the surface of the substrate B, and in the embodiment shown in FIG. 1, the chamber 26 includes a drum 36, a monomer nozzle 38, and a UV irradiator 42.

The organic film forming chamber 26 is a chamber in which the organic film 12 is formed by flash evaporation. Accordingly, the organic film forming chamber 26 is a vacuum chamber equipped with a vacuum evacuation means 44.

The organic film 12 is a film containing a polymer as its main component.

More specifically, the organic film 12 is a film formed from a material selected from among thermoplastic resins such as polyester, acrylic resin, methacrylic resin (the acrylic resin and the methacrylic resin are also collectively referred to as "acrylate polymer"), methacrylic acid-maleic acid copolymer, polystyrene, transparent fluororesin, polyimide, fluorinated polyimide, polyamide, polyamideimide, polyetherimide, cellulose acylate, polyurethane, polyether ether ketone, polycarbonate, alicyclic polyolefin, polyallylate, polyethersulfone, polysulfone, polycarbonate modified with fluorene ring, polycarbonate modified with an alicycle, polyester modified with fluorene ring, and acryloyl compound; polysiloxane and organosilicon compounds.

The organic film 12 may comprise either a single material or a mixture of two or more materials, and it may also comprise two or more layers each comprising the same composition or different compositions. The organic film 12 may not necessarily have a clear boundary with the inorganic film, and the composition may gradually change in the thickness direction as disclosed in US 2004-46497 A.

Preferably, the organic film 12 has high surface smoothness as well as high hardness. The surface smoothness of the organic film 12 is preferably up to 10 nm, and more preferably up to 2 nm in terms of the mean roughness (Ra value) in an area of 10 μm square.

The organic film 12 may preferably have at least some degree of hardness. More specifically, the organic film 12 may preferably have an indentation hardness as measured by nanoindentation method of at least 100 N/mm$^2$, and more preferably at least 200 N/mm$^2$, and a pencil hardness of at least HB, and more preferably H.

The organic film 12 is not particularly limited for its thickness. However, when the organic film 12 is too thin, a uniform thickness will be difficult to achieve whereas an excessively thick film may result in the generation of cracks, and hence in the insufficient barrier properties upon application of external force. From these viewpoints, the thickness of the organic film 12 is preferably in the range of 10 nm to 2 μm, and more preferably from 100 nm to 1 μm.

The organic film 12 may be formed by the methods commonly used in the art such as solution coating and vacuum deposition.

Exemplary solution coating methods include dip coating, air knife coating, curtain coating, roller coating, wire-bar coating, gravure coating, slide coating, and extrusion coating using a hopper as described in U.S. Pat. No. 2,681,294. Alternatively, the organic layer may be formed by applying and curing a commercially available adhesive.

The method used in the vacuum deposition is not particularly limited, and preferable methods include vapor deposition and plasma CVD. Among these, most preferred is flash evaporation described in U.S. Pat. No. 4,842,893, U.S. Pat. No. 4,954,371, and U.S. Pat. No. 5,032,461. The flash evaporation is useful because it has the effect of reducing the oxygen dissolved in the monomer, which improves the degree of polymerization. In the organic film forming chamber 26 shown in FIG. 1, the organic film is formed by the flash evaporation.

In the present invention, the polymer may be applied by solution coating or by applying a hybrid coating containing an inorganic compound as disclosed in JP 2000-323273 A or JP 2004-25732A. Alternatively, the polymer layer may be formed by coating a precursor of the polymer (for example, a monomer) followed by polymerization.

Exemplary preferable monomers that may be used in forming the organic film 12 in the present invention include acrylates, methacrylates, and commercial available adhesives. More specifically, the organic film 12 of the present invention preferably contains as its main component a polymer produced by polymerizing an acrylate monomer and/or a methacrylate monomer having an ethylenically unsaturated bond. When an acrylate monomer and/or a methacrylate monomer is used for preventing the inconvenience in vacuum as described below, the monomer used may preferably have a molecular weight of up to 700, and more preferably 150 to 600.

Exemplary commercially available adhesives include Epo-Tek series available from Daizo Corporation, XNR-5000 series available from Nagase ChemteX Corporation, and 3000 series available from ThreeBond Co., Ltd.

Preferable acrylates and methacrylates include the compounds described in U.S. Pat. No. 6,083,628 and U.S. Pat. No. 6,214,422. Typical examples are as shown below.

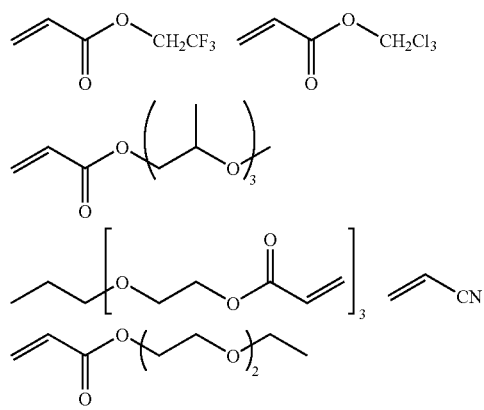

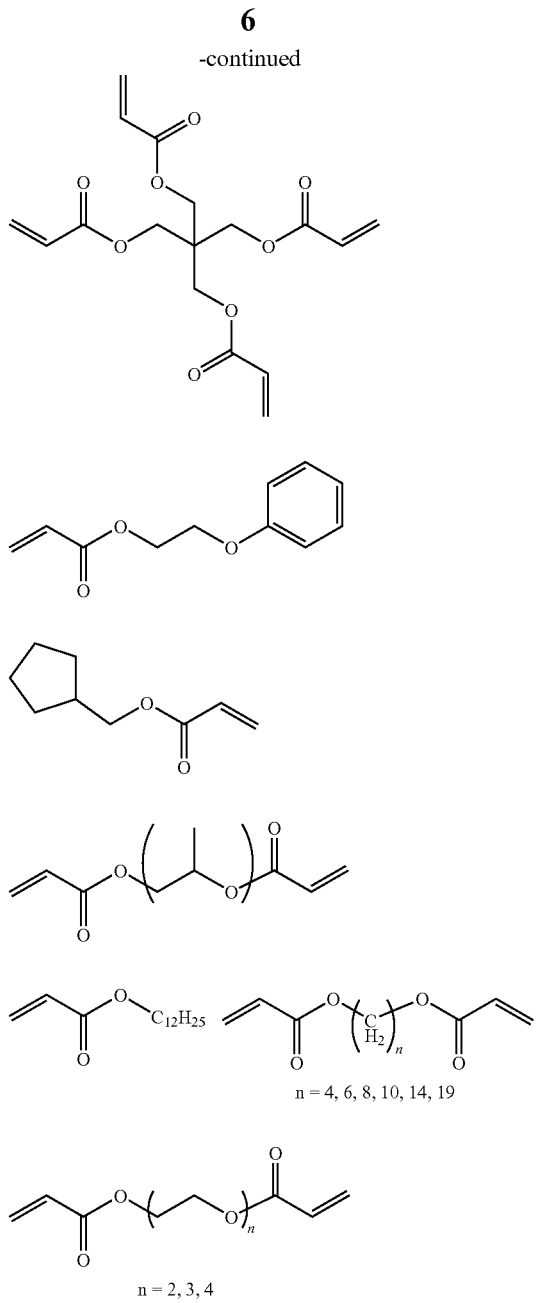

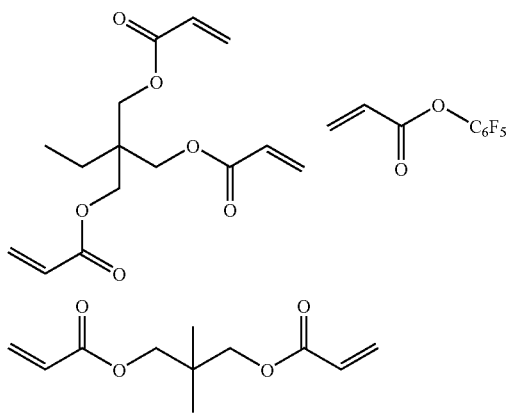
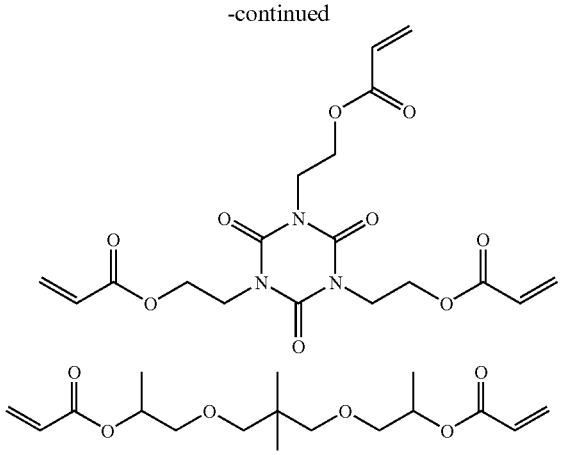
Other examples include the following compounds.
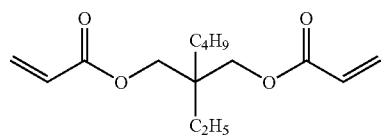
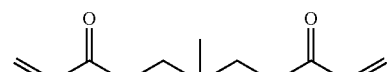
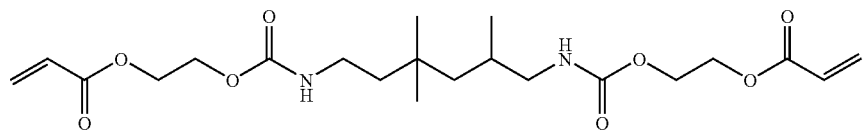
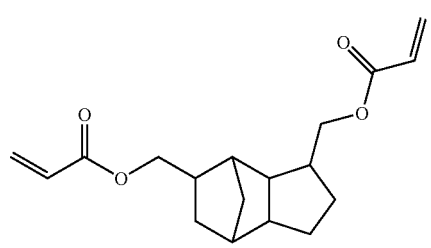
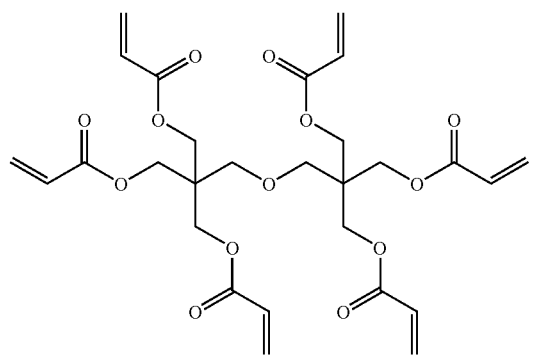
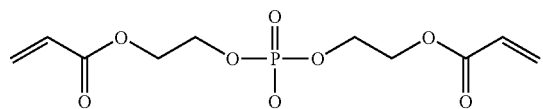
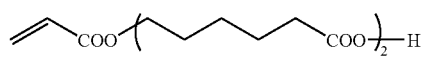
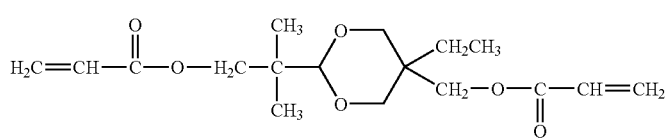

-continued
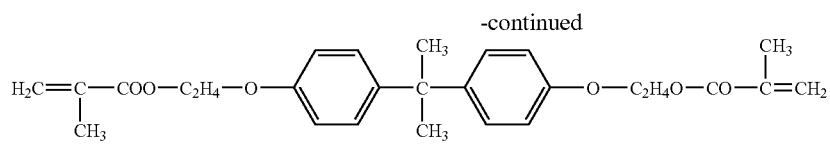
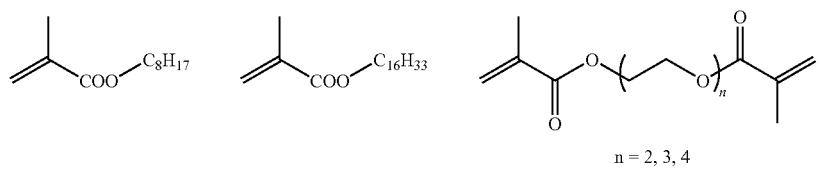
n = 2, 3, 4
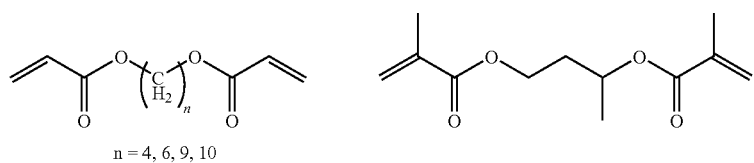
n = 4, 6, 9, 10
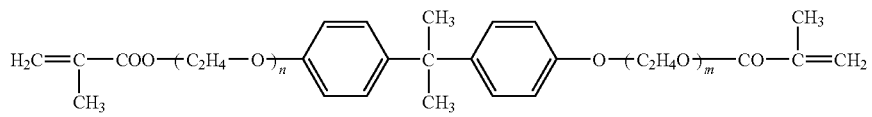
Molecular weight, 572
Molecular weight, 660
Molecular weight, 808
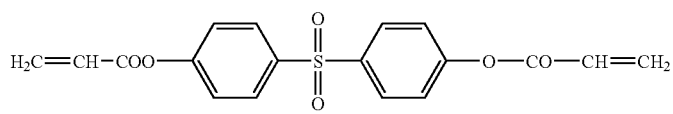
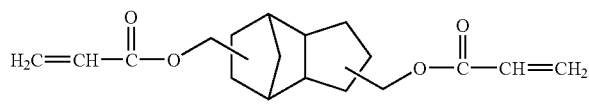
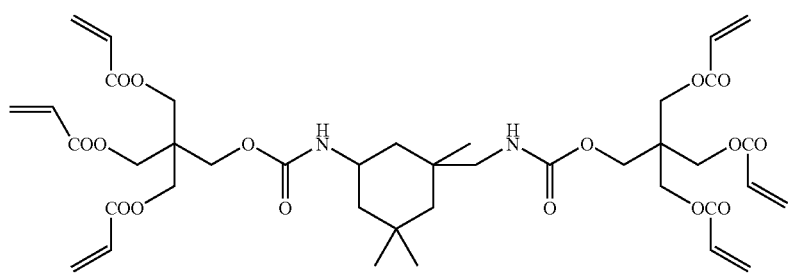
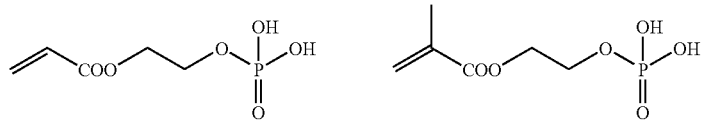
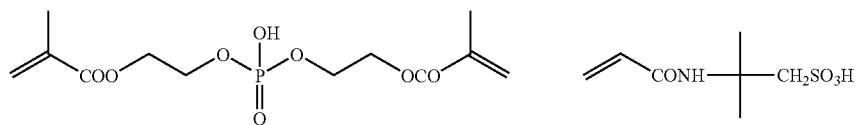
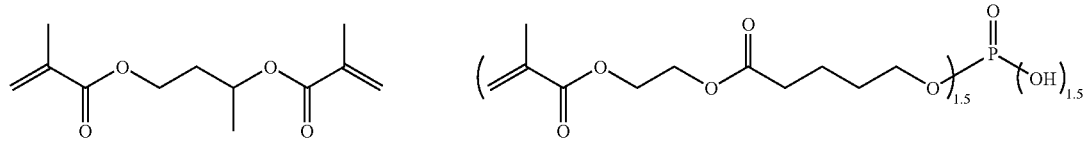

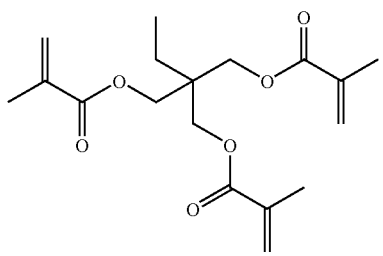
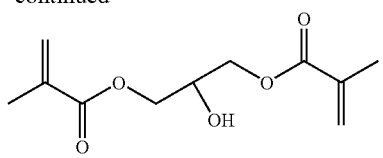

The method used for polymerizing the monomers is not particularly limited, and preferable exemplary methods include thermal polymerization, photopolymerization (by UV light, visible light), electron-beam polymerization, plasma polymerization, and combinations thereof. When the monomers are polymerized by thermal polymerization, the substrate B used should have reasonable heat resistance. In this case, the substrate B should at least have a glass transition temperature (Tg) higher than the temperature to which the substrate B is heated.

When the monomers are polymerized by photopolymerization, simultaneous use of a photopolymerization initiator is preferable. Exemplary photopolymerization initiators include Irgacure series (for example, Irgacure 651, Irgacure 754, Irgacure 184, Irgacure 2959, Irgacure 907, Irgacure 369, Irgacure 379, and Irgacure 819), Darocure series (for example, Darocure TPO and Darocure 1173), and Quantacure PDO commercially available from Ciba Specialty Chemicals Inc., and Esacure series (for example, Esacure TZM and Esacure TZT), and oligomer-type Esacure KIP series commercially available from Sartomer Company.

The beam used for the irradiation is typically UV light from a high pressure mercury vapor lamp or a low pressure mercury vapor lamp and the irradiation energy is preferably at least 0.5 J/cm$^2$, and more preferably at least 2 J/cm$^2$.

It should be noted that polymerization of the acrylate and methacrylate is inhibited by oxygen in the air, and accordingly, when such resin is used for the organic film 12 in the present invention, the polymerization is preferably conducted at a low oxygen concentration or oxygen partial pressure. When the oxygen concentration during the polymerization is reduced by flushing with nitrogen, the oxygen concentration is preferably reduced to the level of up to 2%, and more preferably to the level of up to 0.5%. When the oxygen partial pressure during the polymerization is reduced by reducing the pressure, the total pressure is preferably up to 1000 Pa, and more preferably up to 100 Pa. Particularly preferred is UV polymerization which involves irradiating at least 2 J/cm$^2$ of energy at a reduced pressure of up to 100 Pa.

In the present invention, the monomer is preferably polymerized to the degree of at least 80%, more preferably at least 85%, and still more preferably at least 90%. The term "degree of polymerization" used herein designates the percentage of the polymerizable groups that had reacted in the entire polymerizable groups (for example, acryloyl group and methacryloyl group in the case of acrylate and methacrylate) in the monomer mixture.

In the method for producing the functional film 10 according to the present invention, the most preferable organic film 12 is a film containing as its main component a polymer comprising a constitutional unit represented by the general formula (I) wherein m is 2 and a constitutional unit represented by the general formula (I) wherein m is at least 3.

$(Z\text{-COO})_m\text{-L}$   General formula (I)

In the general formula (I), Z is represented by the following (a) or (b):

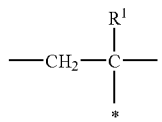

(a)

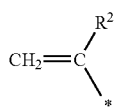

(b)

wherein R$^1$ and R$^2$ each independently represent hydrogen atom or methyl group and * indicates the site to which carbonyl group of the general formula (I) is bound; and L represents an m-valent linking group. While Z which is present at the number of "m" may be the same or different, at least one Z is the one represented by the formula (a).

Preferably, the organic film 12 is the one containing as its main component a polymer selected from a polymer comprising a constitutional unit wherein m is 2 and a constitutional unit wherein m is 3; a polymer comprising a constitutional unit wherein m is 2 and a constitutional unit wherein m is at least 4; and a polymer comprising a constitutional unit wherein m is 2, a constitutional unit wherein m is 3, and a constitutional unit wherein m is at least 4.

Alternatively, a combination of such polymers may constitute the major component of the organic film 12.

L is an m-valent linking group, and in the present invention, L may contain any number of carbon atoms. However, L may preferably contain 3 to 18 carbon atoms, more preferably 4 to 17 carbon atoms, still more preferably 5 to 16 carbon atoms, and most preferably 6 to 15 carbon atoms.

When m is 2, L is a divalent linking group. Examples of such divalent linking groups include alkylene groups (for example, 1,3-propylene group, 2,2-dimethyl-1,3-propylene group, 2-butyl-2-ethyl-1,3-propylene group, 1,6-hexylene group, 1,9-nonylene group, 1,12-dodecylene group, and 1,16-hexadecylene group), ether groups, imino groups, carbonyl groups, and divalent residues comprising two or more such divalent groups linked in tandem (for example, polyethyleneoxy group, polypropyleneoxy group, propionyloxy ethylene group, butylyloxy propylene group, caproyloxy ethylene group, and caproyloxy butylene group).

Among these, an alkylene group is preferred.

L may have a substituent.

Exemplary substituents for the L include alkyl groups (for example, methyl group, ethyl group, and butyl group), aryl groups (for example, phenyl group), amino groups (for example, amino group, methylamino group, dimethylamino group, and diethylamino group), alkoxy groups (for example, methoxy group, ethoxy group, butoxy group, and 2-ethylhexyloxy group), acyl groups (for example, acetyl group, benzoyl group, formyl group, and pivaloyl group), alkoxy-carbonyl groups (for example, methoxycarbonyl group and ethoxycarbonyl group), hydroxy group, halogen atoms (for example, fluorine atom, chlorine atom, bromine atom, and iodine atom), and cyano group. Preferable substituent is a group having no oxygen-containing functional group, and in particular, an alkyl group for the reason as described below.

When m is 2, L is most preferably an alkylene group having no oxygen-containing functional group. Use of such group enables a gas barrier film having a lower water vapor transmission rate to be produced when the present invention is used for the production of the gas barrier film.

When m is 3, L represents a trivalent linking group. Examples of such trivalent linking group include a trivalent residue obtained by removing one hydrogen atom from the divalent linking group as described above and a trivalent residue obtained by substituting any one of the hydrogen atoms of the divalent linking group as described above with an alkylene group, ether group, carbonyl group, or a divalent group comprising any of such groups tandemly coupled with one another. Among these, preferred is a trivalent residue which is obtained by removing one hydrogen atom from an alkylene group and which has no oxygen-containing functional group. Use of such group enables a gas barrier film having a lower water vapor transmission rate to be produced when the present invention is used for the production of the gas barrier film.

When m is 4 or more, L represents a linking group having a valence of 4 or higher. Examples and preferable examples of such linking group having a valence of 4 or higher corresponds to those as described above, and most preferred is a tetravalent residue which is obtained by removing any two hydrogen atoms from an alkylene group and which has no oxygen-containing functional group. Use of such group enables a gas barrier film having a lower water vapor transmission rate to be produced when the present invention is used for the production of the gas barrier film.

In the production method of the present invention, when the polymer constituting the organic film 12 is a polymer comprising a constitutional unit wherein m is 2 and a constitutional unit wherein m is at least 3 in the general formula (I), the constitutional unit wherein m is 2 and/or 3 may be preferably included in an amount of 75 to 95% by weight, more preferably 75 to 90% by weight, and still more preferably 75 to 85% by weight.

When the polymer constituting the organic film 12 is a polymer comprising a constitutional unit wherein m is 2 and a constitutional unit wherein m is 3 in the general formula (I), the constitutional unit wherein m is 2 may be preferably included in an amount of 60 to 80% by weight, and more preferably 65 to 75% by weight, whereas the constitutional unit wherein m is 3 may be preferably included in an amount of 10 to 50% by weight, and more preferably 20 to 40% by weight.

When the content is within such range, a balance will be effectively achieved between the film hardness and the degree of polymerization.

When the polymer constituting the organic film 12 is a polymer comprising a constitutional unit wherein m is 2 and a constitutional unit wherein m is at least 4 in the general formula (I), the constitutional unit wherein m is at least 4 may be preferably included in an amount of 10 to 50% by weight, and more preferably 20 to 40% by weight, and m is preferably 4.

When the polymer constituting the organic film 12 is a polymer comprising a constitutional unit wherein m is 2, a constitutional unit wherein m is 3, and a constitutional unit wherein m is at least 4 in the general formula (I), the constitutional unit wherein m is 2 and the constitutional unit wherein m is 3 may be preferably included in a total amount of 75 to 95% by weight, more preferably 75 to 90% by weight, and still more preferably 75 to 85% by weight; and the constitutional unit wherein m is at least 4 may be preferably included in an amount of 5 to 25% by weight, more preferably 10 to 25% by weight, and still more preferably 15 to 25% by weight.

The polymer which is the main component of the organic film 12 may also include a constitutional unit not represented by the general formula (I).

For example, the polymer may contain the constitutional unit formed in the copolymerization of an acrylate monomer or a methacrylate monomer. In this polymer, the constitutional unit not represented by the general formula (I) is preferably included in an amount of up to 20% by weight, more preferably up to 15% by weight, and still more preferably up to 10% by weight.

As described above, the organic film 12 is a film containing the polymer comprising the constitutional units represented by the general formula (I) as its main component. The term "main component" used in the present invention means that the polymer having the constitutional units represented by the general formula (I) accounts for at least 80% by weight of the total weight of the organic film. It is particularly preferable that such polymer account for at least 90% by weight of the organic film 12.

The polymer not containing the constitutional unit represented by the general formula (I) which may be incorporated in the organic film 12 is not particularly limited, and examples of such polymer include polyester, methacrylic acid-maleic acid copolymer, polystyrene, transparent fluororesin, polyimide, fluorinated polyimide, polyamide, polyamideimide, polyetherimide, cellulose acylate, polyurethane, polyetherketone, polycarbonate, alicyclic polyolefin, polyallylate, polyethersulfone, polysulfone, polycarbonate modified with fluorene ring, polycarbonate modified with an alicycle, and polyester modified with fluorene ring.

Such polymer which is the main component of the organic film 12 can be prepared by polymerizing a mixture (monomer mixture) containing a monomer wherein n is 2 in the following general formula (II) and a monomer wherein n is at least 3 in the following general formula (II).

General formula (II)

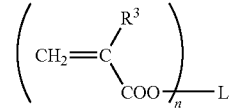

In the general formula (II), $R^3$ represents hydrogen atom or methyl group, and L represents an n-valent linking group. When n is at least 2, each $R^3$ may be the same or different.

In other words, the production method of the functional film 10 of the present invention is most preferably a production method comprising the steps of forming an organic film 12 on a substrate B by polymerizing a monomer mixture containing a monomer wherein n is 2 and a monomer wherein n is at least 3 in the general formula (II), and subsequently, forming an inorganic film 14 by vacuum deposition. In this method, the substrate B having the organic film 12 formed thereon is handled, namely, conveyed in vacuum with nothing contacting the surface of the organic film 12 until the formation of the inorganic film 14 is completed.

The preferable examples and preferable range for L are the same as those described for the general formula (I).

The preferable ranges for the contents of the monomer wherein n is 2 and the monomer wherein n is at least 3 (or the monomer wherein n is 3 and the monomer wherein n is at least 4) in the monomer mixture are also the same as the preferable ranges for the contents of the monomer wherein n is 2 and the monomer wherein n is at least 3 (or the monomer wherein n is 3 and the monomer wherein n is at least 4) in the general formula (I).

In the present invention, the organic film 12 is preferably formed by polymerizing a monomer mixture containing a monomer wherein n is 2 and a monomer wherein n is 3, by polymerizing a monomer mixture containing a monomer wherein n is 2 and a monomer wherein n is at least 4, or by polymerizing a monomer mixture containing a monomer wherein n is 2, a monomer wherein n is 3, and a monomer wherein n is at least 4.

Alternatively, the organic film 12 may be formed by polymerizing two or more of such monomer mixtures.

Examples of the monomer wherein n is 2 or 3 in the general formula (II) are shown below, which by no means limit the monomer wherein n is 2 or 3 that can be used in the present invention.

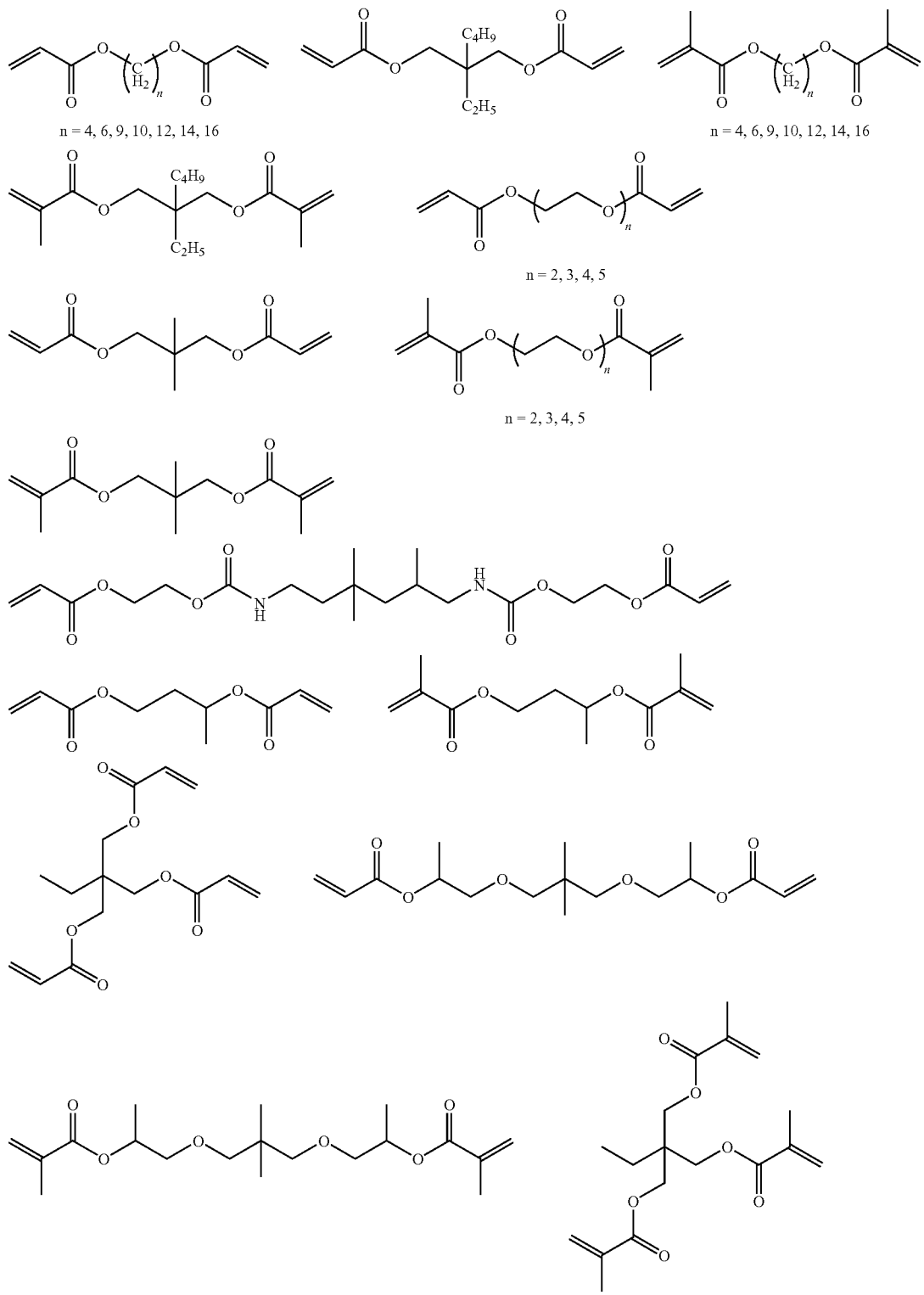

-continued

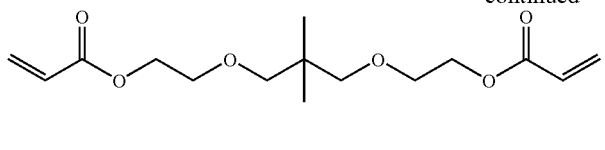
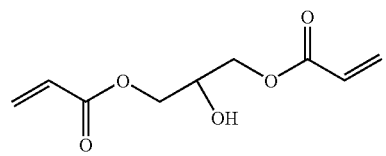
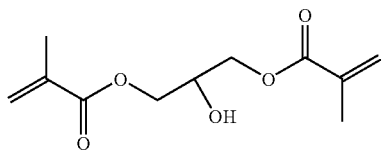
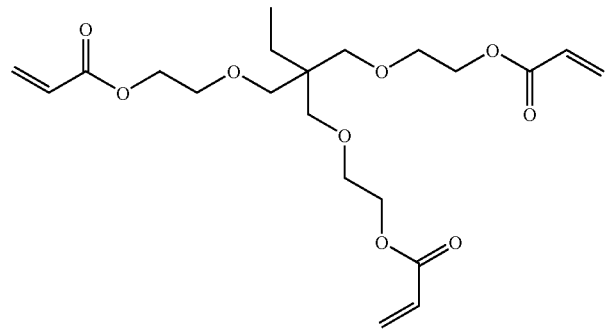
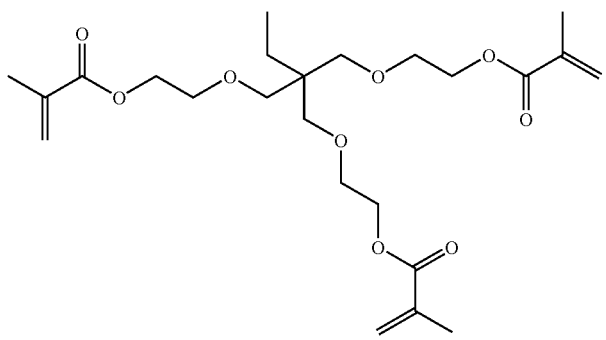

The monomer wherein n is at least 4 in the general formula (II) is preferably a monomer wherein n is 4 to 6, and more preferably, a monomer wherein n is 4. Exemplary such monomers include a monomer having a pentaerythritol skeleton or dipentaerythritol skeleton.

Examples of the monomer wherein n is at least 4 in the general formula (II) are shown below, which by no means limit the monomer wherein n is at least 4 that can be used in the present invention.

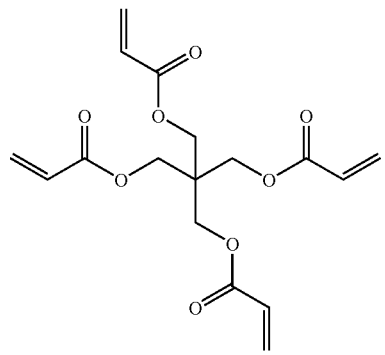
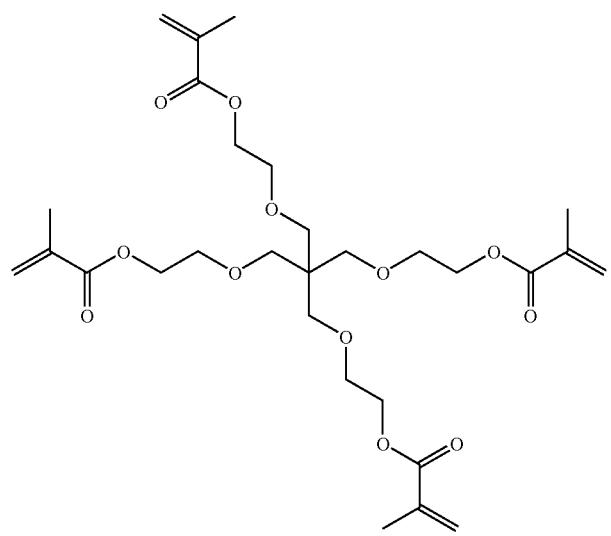

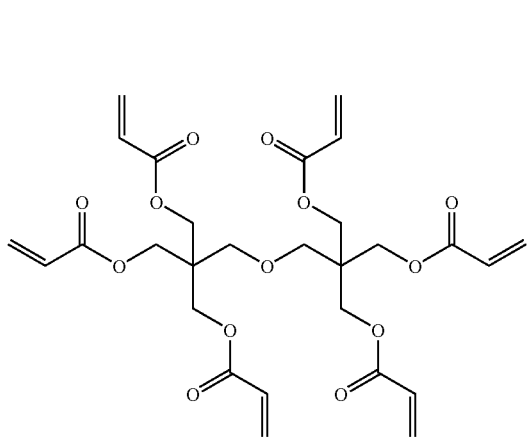
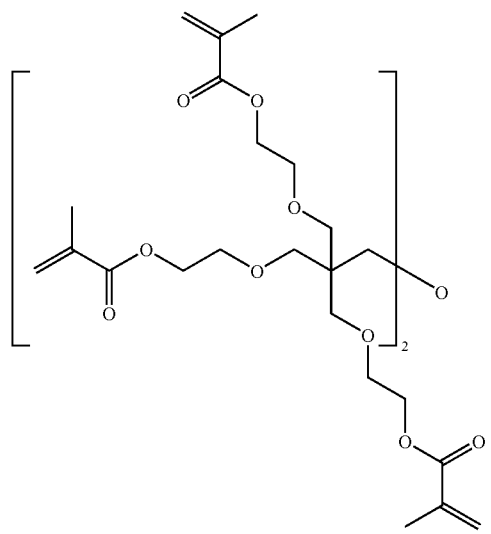
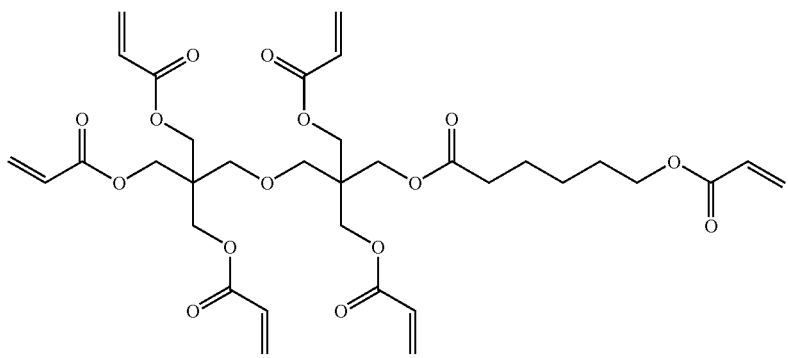
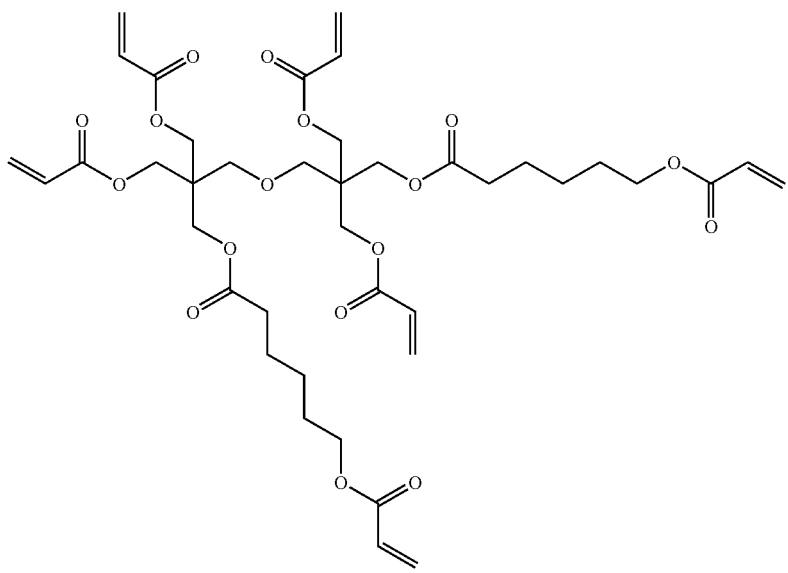

-continued
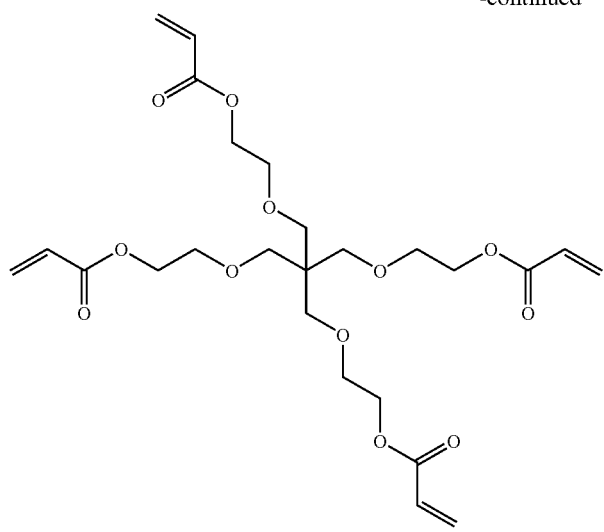
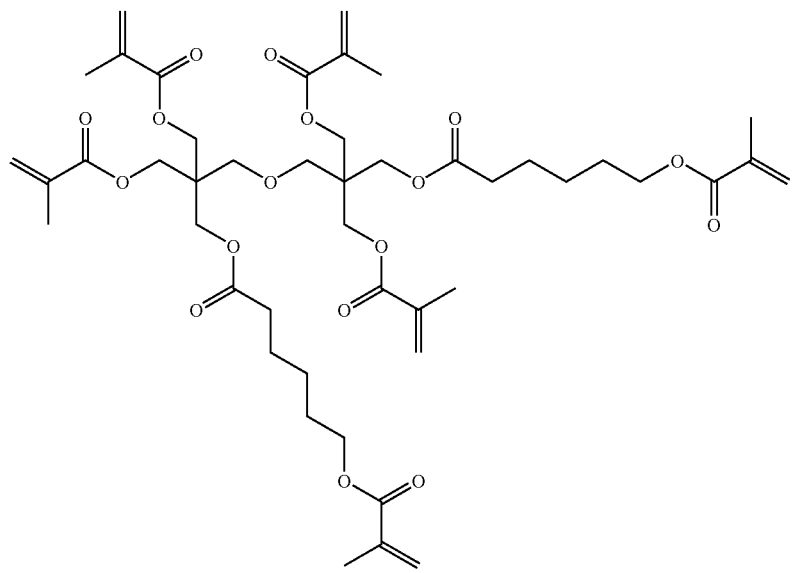
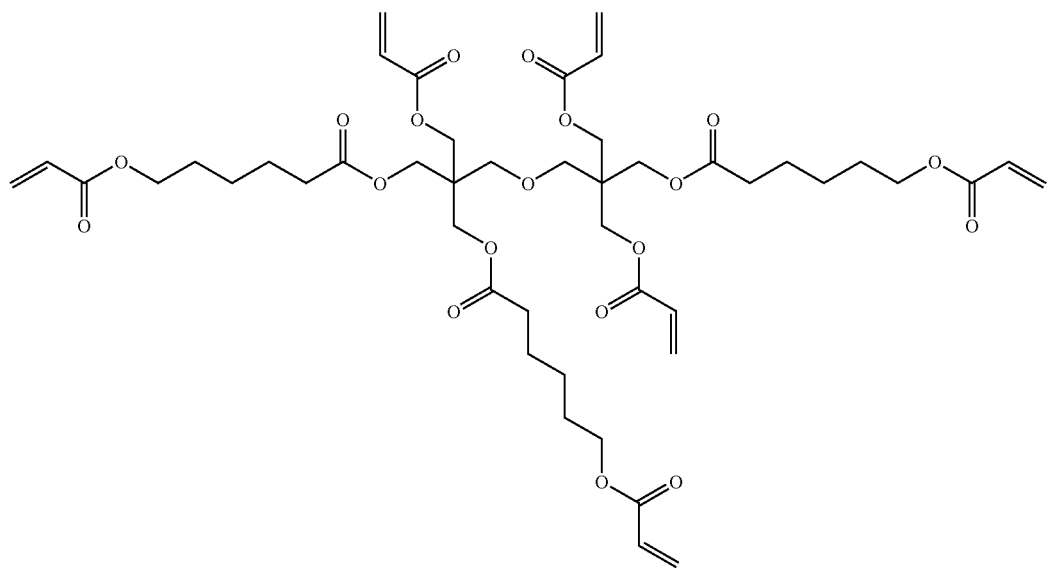

-continued

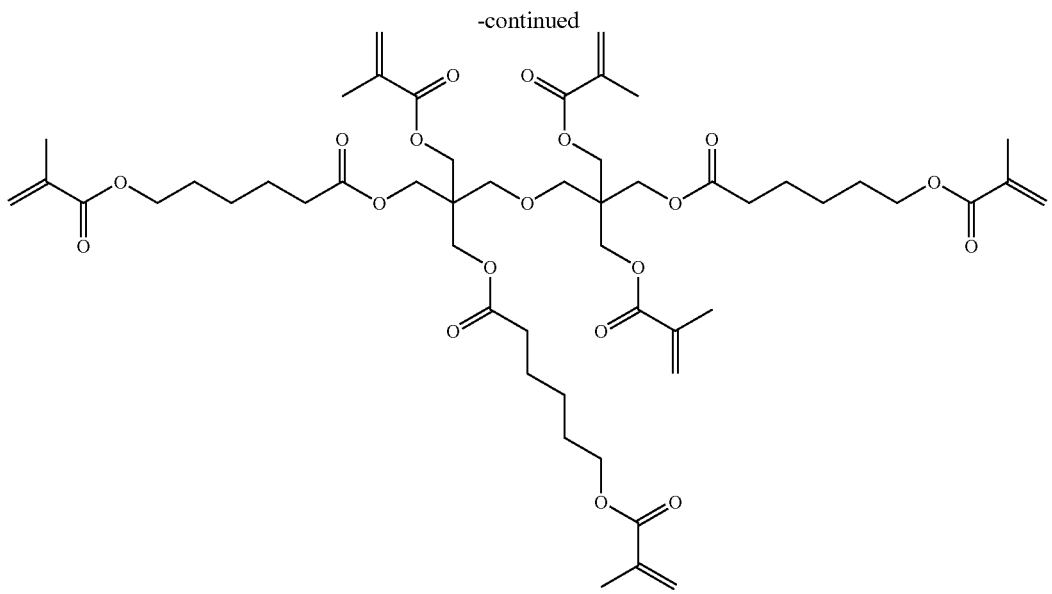

The monomer mixture may contain one type of or two or more types of monomer for each of the monomer wherein n is 2 and the monomer wherein n is at least 3 (or the monomer wherein n is 3 and the monomer wherein n is at least 4) in the general formula (II).

As described above, in the present invention, the resulting functional film will have favorable properties when the organic film 12 is harder. More specifically, the organic film 12 preferably has a pencil hardness of at least H, and in particular at least 2H.

The hardness of the organic film 12 can be increased, for example, by the following methods:

(1) the degree of polymerization of the monomer is increased;

(2) a polyfunctional monomer is used; and (3) an oxygen-containing functional group which is highly flexible as the linking group of the monomer is not used.

The degree of polymerization and the number of functional groups are in a trade off relation, and more specifically, the degree of polymerization reduces with the increase in the number of functional groups. The inventors of the present invention examined the composition of the polymer and found that such monomer mixing rate is preferable in order to have an increased number of functional groups of the monomer and an increased degree of polymerization. More specifically, the degree of polymerization is at least 90%.

In order to form the organic film 12 having favorable hardness, the mixing ratio of the monomer components are preferably adjusted in the range as described below.

For example, when only the monomer wherein n is 2 and the monomer wherein n is 3 are used for the monomer mixture as the monomer components represented by the general formula (II), the monomer wherein n is 2 is preferably used at a mixing ratio of 60 to 80% by weight, and more preferably 65 to 75% by weight. The monomer wherein n is 3 is preferably used at a mixing ratio of 20 to 40% by weight, and more preferably 25 to 35% by weight.

When only the monomer wherein n is 2 and the monomer wherein n is at least 4 are used for the monomer mixture as the monomer components represented by the general formula (II), the monomer wherein n is 2 is preferably used at a mixing ratio of 75 to 95% by weight, more preferably 75 to 90% by weight, and still more preferably 75 to 85% by weight. The monomer wherein n is at least 4 is preferably used at a mixing ratio of 5 to 25% by weight, more preferably 10 to 25% by weight, and still more preferably 15 to 25% by weight.

When only the monomer wherein n is 2, the monomer wherein n is 3, and the monomer wherein n is at least 4 are used for the monomer mixture as the monomer components represented by the general formula (II), the monomer wherein n is 2 and the monomer wherein n is 3 are preferably used at a total mixing ratio of 75 to 95% by weight, more preferably 75 to 90% by weight, and still more preferably 75 to 85% by weight. The monomer wherein n is at least 4 is preferably used at a mixing ratio of 5 to 25% by weight, more preferably 10 to 25% by weight, and still more preferably 15 to 25% by weight.

The monomer mixture used for forming the organic film 12 may also include monomers not represented by the general formula (II). These monomers, however, have adverse effects on the increase in the hardness of the organic film 12, and accordingly are preferably used in the monomer mixture in an amount of up to 20% by weight.

Examples of the monomers not represented by the general formula (II) include monofunctional monomers, and preferably, monofunctional acrylate monomers and monofunctional methacrylate monomers. The monofunctional acrylate monomers and the monofunctional methacrylate monomers are not particularly limited for their molecular weight. However, typical molecular weight of such monomers used is in the range of 150 to 600. The monomer mixture may contain one, or two or more of such monomers. While the monofunctional monomer is effective in increasing the degree of polymerization, excessive incorporation results in the loss in the hardness of the organic film formed, and therefore, the content is preferably adjusted to 20% by weight or less. Such monomer is more preferably used in the content which is the same as the preferable content of the constitutional unit not represented by the general formula (I).

Examples of the preferable monofunctional monomers are shown below, which by no means limit the monofunctional monomers that can be used in the present invention.

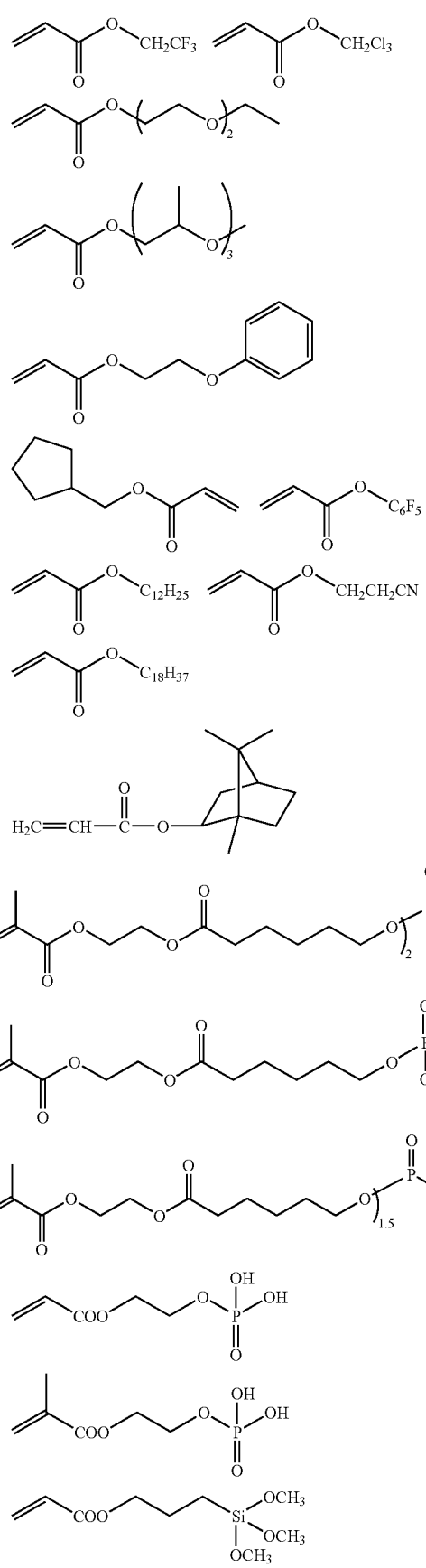
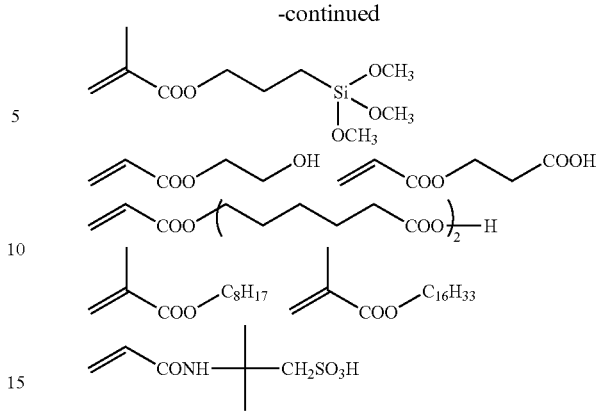
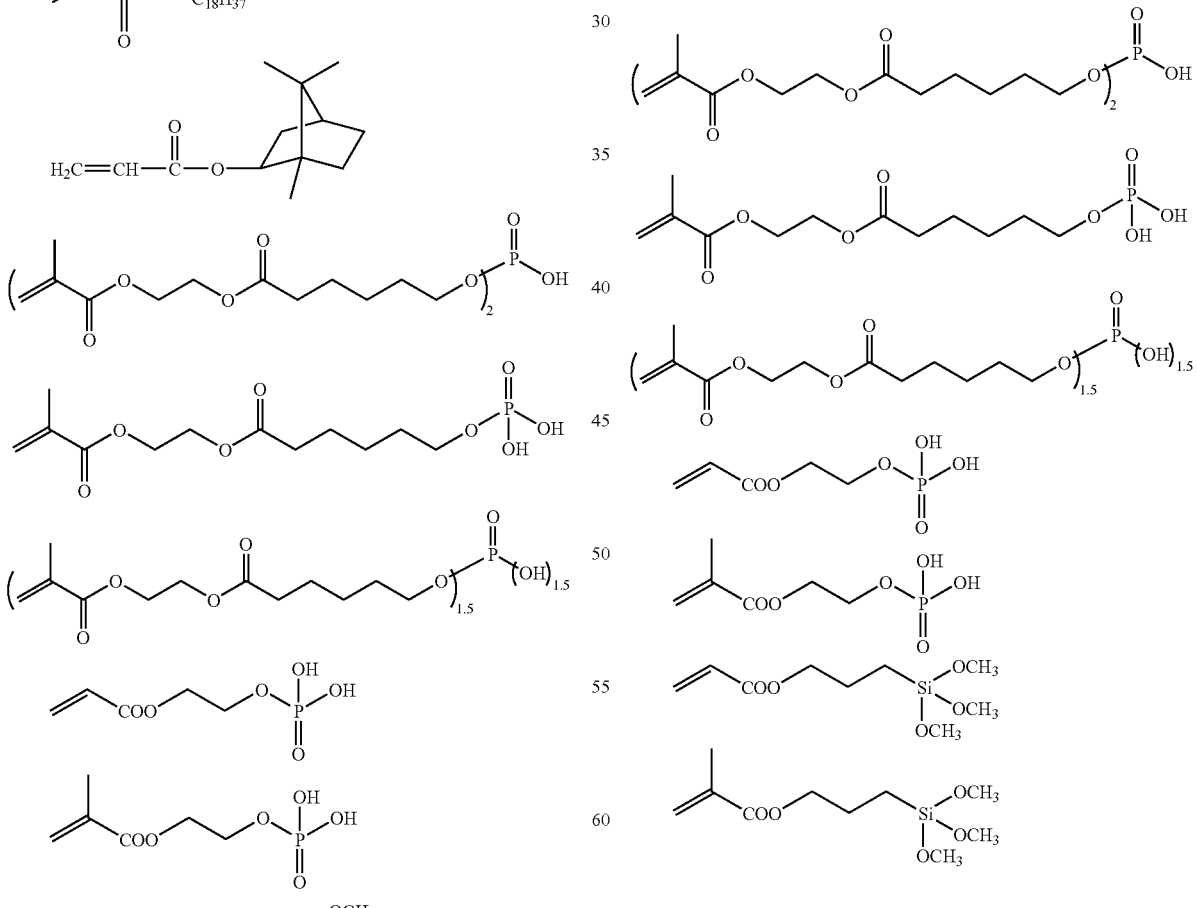

The monomer mixture for forming the organic film 12 may also contain a phosphate (meth)acrylate monomer or a (meth) acrylate monomer containing a silane coupling group in order to improve the adhesion. Such monomer may be added within the range as described above depending on its number of functional groups.

Preferable examples of the phosphate monomer or the monomer containing a silane coupling group are shown below, which by no means limit the scope of the present invention.

As described above, the organic film forming chamber 26 is a vacuum chamber, and comprises the drum 36, the monomer nozzle 38, the UV irradiator 42, and the vacuum evacuation means 44.

The drum 36 is a cylindrical member which rotates around the central axis in the direction shown by an arrow in FIG. 1. The substrate B conveyed from the substrate feeding chamber 24 is wrapped around a predetermined region of the peripheral surface of the drum 36 so that it is supported and guided by the drum 36, and conveyed along the predetermined pathway. After forming the organic film 12, the substrate B is conveyed to the inorganic film forming chamber 28 to be described below.

In the organic film forming chamber 26, the organic film 12 is formed by applying the preliminarily prepared coating composition containing the monomer mixture by flash evaporation and polymerizing the coating.

In the formation of the organic film 12, the organic film forming chamber 26 is evacuated to a predetermined degree of pressure (degree of vacuum) by the vacuum evacuation means 44. The vacuum evacuation means 44 used may be the one known in the art, and this also applies to a vacuum evacuation means 50 used in the inorganic film forming chamber 28 as described below.

The monomer nozzle 38 is provided for applying the preliminarily prepared coating composition containing the monomer as described above on the surface of the substrate B under such reduced pressure, and a film is thereby coated on the surface of the substrate B by flash evaporation.

The UV irradiator 42 is used for irradiating the coating that had been formed by flash evaporation with UV (ultraviolet) light to polymerize the monomer to thereby form the organic film 12.

The light source that can be used and the irradiation energy are as described above. The method used for the polymerization of the monomer is also not limited to the UV irradiation shown in FIG. 1, and as described above, various methods can be used for the monomer polymerization.

When the organic film 12 is the one prepared by polymerizing an acrylate monomer and/or a methacrylate monomer, a low oxygen concentration is preferably used during the polymerization as described above.

In the method for producing the functional film 10 of the present invention, the organic film is not limited to the one comprising a single layer as shown in the drawings, and it may comprise two or more layers.

In such a case, the organic film layers may have the same composition or different compositions. When two or more layers of organic film are formed on the substrate, each layer may preferably have the composition that falls within the range as described above.

The substrate B on which the organic film 12 was formed in the organic film forming chamber 26 (hereinafter simply referred to as the "substrate B") is then conveyed to the inorganic film forming chamber 28.

The inorganic film forming chamber 28 is provided for depositing (forming) the inorganic film 14 on the surface of the substrate B (namely, on the surface of the organic film 12) by vacuum deposition, and it comprises a drum 46, film forming means 48a, 48b, 48c, and 48d, and the vacuum evacuation means 50.

The substrate B is conveyed into the inorganic film forming chamber 28 through a slit 54a formed in a separation wall 54 between the organic film forming chamber 26 and the inorganic film forming chamber 28.

The inorganic film forming chamber 28 is a vacuum chamber, which is substantially airtightly separated from the adjacent space. Accordingly, the slit 54a should have a minimum size which allows passage of the substrate B without coming in contact with the separation wall 54. This also applies to an outlet 28a through which the substrate B having the inorganic film 14 formed thereon is carried away from the inorganic film forming chamber 28.

When the film formation by sputtering or plasma CVD is conducted in the inorganic film forming chamber 28, an RF power supply is also installed in the inorganic film forming chamber 28.

As in the case of the organic film forming chamber 26, the drum 46 in the inorganic film forming chamber 28 is also a cylindrical member which rotates around the central axis in the direction shown by an arrow in FIG. 1.

The substrate B conveyed from the organic film forming chamber 26 is wrapped around a predetermined region of the peripheral surface of the drum 46 so that it is supported and guided by the drum 46, and then, conveyed along the predetermined pathway. The inorganic film 14 is formed on the surface (namely, on the organic film 12) by the film forming means 48a to 48d and the like. When the film formation by sputtering or plasma CVD is conducted in the inorganic film forming chamber 28, the drum 46 may be grounded so that it also functions as a counter electrode. Alternatively, the drum 46 may be connected to the RF power supply.

The film forming means 48a to 48d are provided for the purpose of forming the inorganic film 14 on the surface of the substrate B by vacuum deposition.

The method used for the formation of the inorganic film 14 in the present invention is not particularly limited, and any vacuum deposition (vapor-phase deposition) techniques known in the art such as CVD, plasma CVD, sputtering, vacuum evaporation, and ion plating may be used.

Accordingly, in the production device 20, the film forming means 48a to 48d include various members adequately selected depending on the method of vacuum deposition used for the film formation.

For example, when the inorganic film 14 is formed in the inorganic film forming chamber 28 by ICP-CVD (inductively coupled plasma CVD), the film forming means 48a to 48d include an induction coil for forming an induced magnetic field, and a gas supply means for supplying a reactive gas on the region where the film is formed.

When the inorganic film forming chamber 28 is the one where the inorganic film 14 is formed by CCP-CVD (capacitively coupled plasma CVD), the film forming means 48a to 48d include a shower head electrode which is hollow and has a large number of small holes at the surface facing the drum 46, which is connected to the reactive gas supply source, and which functions as an RF electrode and a means for supplying the reactive gas.

When the inorganic film forming chamber 28 is the one where the inorganic film 14 is formed by CVD, the film forming means 48a to 48d include a means for introducing the reactive gas.

When the inorganic film forming chamber 28 is the one where the inorganic film 14 is formed by sputtering, the film forming means 48a to 48d include a means for supporting a target, an RF electrode, and a means for supplying a sputtering gas.

The vacuum evacuation means 50 is used for evacuating the inorganic film forming chamber 28 to a degree adequate for the formation of the inorganic film 14 by vacuum deposition.

The vacuum evacuation means 50 is not particularly limited, and exemplary means that may be used include vacuum pumps such as a turbo pump, a mechanical booster pump and a rotary pump, an assist means such as cryogenic coil, and various other known (vacuum) evacuation means which use a means for adjusting the ultimate degree of vacuum or the amount of discharge air and are employed in vacuum deposition devices.

As shown in FIG. 1, in the production device 20, the substrate B is conveyed to the inorganic film forming chamber 28 after forming the organic film 12 on the substrate B in the organic film forming chamber 26 which is a vacuum chamber for conducting flash evaporation. The surface of the substrate B (namely, the surface of the organic film 12) does not come in contact with anything during conveyance. In the inorganic film forming chamber 28 which is also a vacuum chamber, the film forming means 48a to 48d are used to form the inorganic film 14 on the substrate B being conveyed, and while the substrate B is conveyed, the surface of the substrate B does not come in contact with anything. The substrate B having the inorganic film 14 formed thereon, namely, the functional film 10 produced by the production method of the present invention is then carried away from the inorganic film forming chamber 28.

As described above, in the production method of the present invention, contact with other member of the surface of the organic film 12 having been formed in a predetermined manner is avoided while the substrate B is conveyed (handled) in vacuum until the completion of the formation of the inorganic film 14. This enables consistent production of the high quality functional film 10 having the organic film 12 and the inorganic film 14 which is capable of preventing the deterioration of the performance or properties of the organic film 12 and its surface properties and exhibiting sufficient performance or properties of the organic film 12, thus having the intended performance.

The inventors of the present invention made an intensive investigation to realize a functional film such as a gas barrier film having high performance, and as a result found that the performance of the resulting functional film can be improved by providing, as described in JP 2002-264274 A as well, an organic film underneath the inorganic film which has the intended function.

The inventors of the present invention made further investigation, and found that a functional film having an even higher performance can be produced by using an organic film 12 containing as its main component a polymer produced by polymerizing an acrylate monomer and/or methacrylate monomer, and in particular, by using an organic film 12 containing as its main component a polymer comprising a constitutional unit represented by the general formula (I) wherein m is 2 and a constitutional unit wherein m is at least 3.

$$(Z\text{-COO})_m\text{-L} \qquad \text{General formula (I)}$$

In the general formula (I), Z is represented by the following (a) or (b):

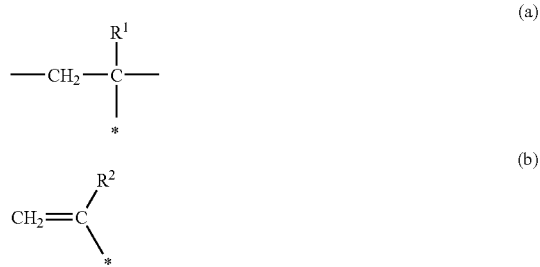

wherein $R^1$ and $R^2$ each independently represent hydrogen atom or methyl group and * indicates the site to which carbonyl group of the general formula (I) is bound; and L represents an m-valent linking group. While Z which is present at the number of "m" may be the same or different, at least one Z is the one represented by the formula (a).

The reason why the improvement in the performance of the functional film is realized by the provision of the organic film 12 is unknown. The speculation of the inventors of the present invention, however, is as described below.

The organic film 12 has excellent surface smoothness and other surface properties, and when the inorganic film 14 is formed on the organic film 12 by vacuum deposition, crystallinity and the direction of the crystal growth of the inorganic film 14 will be favorable, and the resulting inorganic film 14 will be extremely compact with excellent crystallinity and high smoothness.

As a consequence, the inorganic film 14 will be capable of fulfilling the intended function, and a high quality functional film having the intended performance is thereby realized.

However, in the course of the investigation, the inventors of the present invention found that the resulting functional film often failed to exhibit the intended performance when the inorganic film 14 is formed on the organic film 12 by vacuum deposition.

In the course of the investigation for finding the cause for such phenomenon, the inventors of the present invention found that the pair of conveyor rollers provided in the vacuum chamber where the vacuum deposition takes place had been the cause. In the further investigation, the inventors also found that, while no problem occurs at atmospheric pressure (normal pressure) or at a low degree of vacuum, surface smoothness and other properties are greatly damaged when something comes in contact with the surface in vacuum in which vacuum deposition is carried out (for example, at a pressure of up to 1000 Pa), and more specifically, such damage is significant when the surface is pressed as in the case where the substrate is nipped between and conveyed through a pair of conveyor rollers.

The inventors also found that such damage is significant when the organic film 12 is an organic film containing a polymer produced by polymerizing an acrylate monomer and/or methacrylate monomer having an ethylenically unsaturated bond as its main component, and in particular, an organic film containing as its main component a polymer comprising the constitutional unit represented by the general formula (I) wherein m is 2 and the constitutional unit represented by the general formula (I) wherein m is at least 3. The damage is also likely to occur when the acrylate monomer and/or the methacrylate monomer has a molecular weight exceeding 700.

The reason why such damage of the organic film 12 occurs is unknown. The speculation of inventors of the present invention, however, is as described below.

The organic film 12 does not show any change at atmospheric pressure, and there is no problem if the substrate is conveyed (or handled) by a pair of conveyor rollers or a surface treatment is conducted by bringing the surface into contact with some member.

However, in vacuum, the monomer which failed to react precipitates from the organic film 12 to its surface, and when a member such as a pair of conveyor rollers comes in touch with such surface, this monomer is transferred onto this member and then retransferred onto the surface of the organic film 12. When the member such as a pair of conveyor rollers presses the organic film 12, the unreacted monomer having been transferred onto such member and the unreacted monomer having precipitated on or in the vicinity of the surface of the organic film 12 will be pushed into the organic film 12. As a consequence, the surface smoothness and other properties of the organic film 12 are greatly damaged when the member comes in contact with or presses the surface of the organic film 12.

Accordingly, the crystallinity and the direction of the crystal growth of the inorganic film 14 are greatly damaged when the inorganic film 14 is formed on such surface, and the inorganic film 14 will also have cracks and missing parts, which adversely affects the function of the inorganic film 14. In such a case, production of the functional film having the intended performance is no longer possible.

The present invention has been completed on the bases of such findings, and in the present invention, the inorganic film 14 is formed after forming the organic film 12, and the substrate is conveyed (or handled) in vacuum (in the vacuum chambers) so that no member comes in contact with the surface of the organic film 12 until the formation of the inorganic film 14 is completed.

Because of such procedure, the method for producing a functional film according to the present invention is capable of realizing consistent production of a functional film which has the intended performance and in which loss of performance and properties of the organic film 12 has been prevented to realize excellent surface smoothness and other surface properties so that the overlying inorganic film 14 can fully exhibit its inherent performance.

In the production method of the present invention, the inorganic film 14 to be formed is not particularly limited, and a film of any inorganic substance suitable for the functional film 10 to be produced may be used as long as such film can be formed by vacuum deposition.

In addition, the inorganic film 14 is not particularly limited for its thickness, and an adequate thickness may be determined depending on the performance required for the inorganic film 14 and the functional film 10 to be formed.

For example, when the functional film 10 produced is a gas barrier film (water vapor barrier film), the inorganic film 14 may be, for example, a film of silicon nitride, aluminum oxide, or silicon oxide.

When the functional film 10 produced is a protective film for a device such as organic EL display, liquid crystal display, or other display, the inorganic film 14 may be, for example, a film of silicon oxide.

When the functional film 10 produced is an optical film such as an antireflection film, a light reflecting film, or any of various filters, the inorganic film 14 may be, for example, a film comprising a material having the intended optical properties or capable of exhibiting the intended optical properties.

The present invention is very suitable for the production of a gas barrier film, because the organic film 12 has excellent surface smoothness and other favorable surface properties, and such properties of the organic film 12 enable formation of an inorganic film 14 which is compact with extremely few cracks and missing parts and which has high smoothness and good gas barrier properties.

In the present invention, after completing the formation of the inorganic film 14, the surface of the substrate B, namely, the surface of the inorganic film 14 (functional film 10) may be brought in contact with other members. In other words, in the inorganic film forming chamber 28 of the embodiment shown in FIG. 1, a member which can be brought in contact with the surface of the substrate B may be provided downstream of the film formation means 48*d*.

In the present invention, the rear surface of the substrate B (the side opposite to the surface on which the organic film 12 is formed) may also come in contact with other members either in the atmosphere or in vacuum. Furthermore, various members which come in contact with the surface of the organic film 12 such as a pair of conveyor rollers may be used in the atmosphere.

In the production method of the present invention, the means used for the formation of the inorganic film 14 in the inorganic film forming chamber is not limited to the 4 film forming means 48*a* to 48*d*, and the inorganic film 14 may be formed by 3 or less film forming means or 5 or more film forming means.

Furthermore, the inorganic film 14 is not limited to the one comprising a single layer, and it may comprise two or more layers which may be the same or different from each other.

In the production device 20, the substrate B having the inorganic film 14 formed thereon by the film forming means 48*a* to 48*d*, namely, the functional film 10 is conveyed through the outlet 28*a* to the take-up chamber (not shown) and the film is guided by a guide roller 52 to be wound on a winding shaft into a roll so that it can be used in the subsequent step as a roll of functional film.

In the embodiment shown in FIG. 1, the take-up chamber is not shown. However, as is seen from FIG. 1 showing a part of a wall 55 of the take-up chamber, the take-up chamber of the production device 20 is also a vacuum chamber as in the substrate feeding chamber 24, and the take-up chamber is evacuated to a predetermined pressure by a vacuum evacuation means (not shown) to thereby prevent the pressure in the take-up chamber from adversely affecting the formation of the inorganic film 14 in the inorganic film forming chamber 28.

In the production device 20 shown in FIG. 1, a drum is provided in each of the organic film forming chamber 26 and the inorganic film forming chamber 28, and by wrapping the substrate B around each drum, the substrate B is conveyed to form the organic film 12 and the inorganic film 14 to thereby produce the functional film 10.

However, the device used in the method for producing a functional film according to the present invention is not limited to the one having such constitution, and devices of various constitutions may be used as long as contact of other member with the surface of the organic film 12 in vacuum is avoided.

Figure 2:
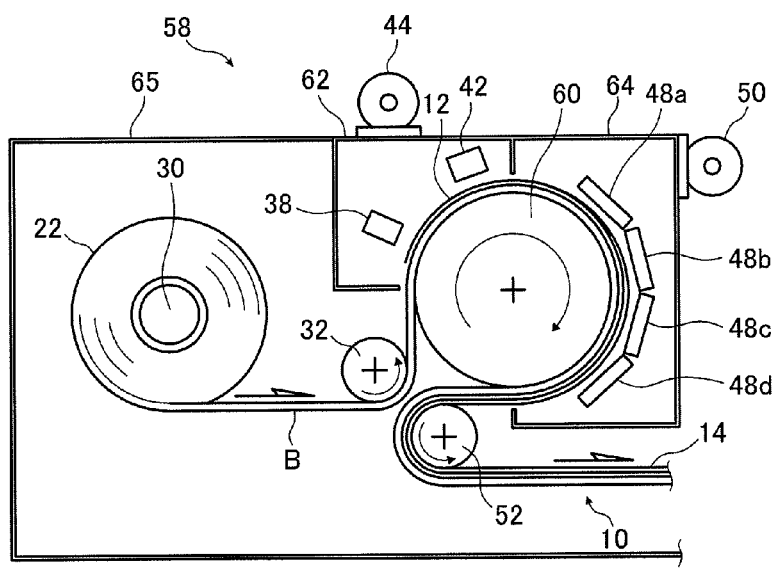
FIG. 2 is a schematic view showing another embodiment of the production device for implementing the functional film production method of the present invention.

For example, a functional film production device 58 shown in FIG. 2 may be provided with only one drum 60 so that an organic film forming chamber 62 having a monomer nozzle 38 and a UV irradiator 42 and an inorganic film forming chamber 64 having film forming means 48*a* to 48*d* may be formed in this order in the rotational direction of the drum 60 to enable the organic film 12 and the inorganic film 14 to be continuously formed on the same drum 60.

In the functional film production device 58, a feed means of the substrate B and a take up means of the functional film are provided in a feed/take-up chamber communicating with the organic film forming chamber 62 and the inorganic film forming chamber 64 as is seen from FIG. 2 showing a part of the wall 65. This feed/take-up chamber is a vacuum chamber which is evacuated to a predetermined pressure by a vacuum evacuation means (not shown) to prevent the pressure in the feed/take-up chamber from adversely affecting the formation of the organic film 12 and the inorganic film 14.

The production method of the present invention is not limited to the embodiment in which the organic film 12 and the inorganic film 14 are continuously formed while the substrate B is conveyed as long as contact of the surface of the organic film 12 with some member in vacuum is avoided.

For example, the substrate B having the organic film 12 formed thereon may be wound into a roll and fed to a device for use in forming the inorganic film 14 such that the inorganic film 14 is formed on the organic film 12 to produce the functional film 10. An exemplary embodiment is shown in FIGS. 3A and 3B.

Figure 3A:
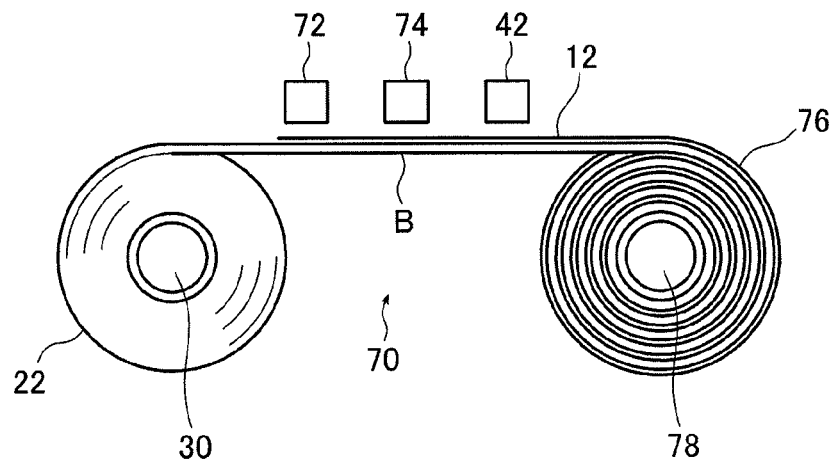
FIGS. 3A and 3B are schematic views showing further embodiment of the production device for implementing the functional film production method of the present invention.
Figure 3B:
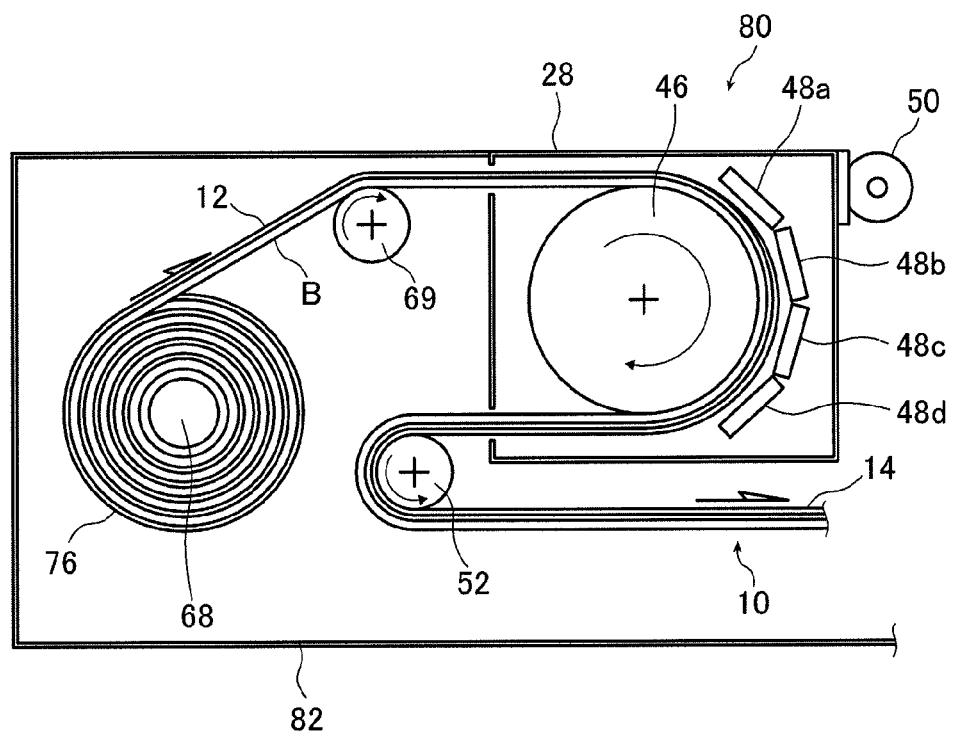

In this embodiment, the organic film 12 is formed on the surface of the organic film 12 by an organic film formation device 70 as schematically shown in FIG. 3A.

The organic film formation device 70 comprises a coater means 72, a dryer means 74 and a UV irradiator 42, and the organic film 12 is formed by applying a preliminarily prepared coating composition containing the monomer as described above on the substrate B by the coater means 72 and drying the coating for polymerization. As described above, in the present invention, the coating composition containing the monomer preferably contains a photoinitiator when the organic film 12 is formed by photopolymerization, for example, by irradiating the coating with UV or visible light.

In this organic film formation device 70 as well, the organic film is formed by a roll-to-roll system. The substrate B is mounted as above on a rotary shaft 30 to give a substrate roll 22, and is conveyed in its longitudinal direction to form the organic film 12 on the substrate B. The substrate having the organic film 12 formed thereon is wound on a winding shaft 78 as a substrate roll 76.

The substrate B fed from the substrate roll 22 is first conveyed to the coater means 72 which applies to the surface of the substrate B, the preliminarily prepared coating composition containing the monomer which will constitute the organic film 12. As described above, any method commonly used for applying a liquid may be used for applying the coating composition.

Next, the substrate B is conveyed to the dryer means 74, where the coating composition applied by the coater means 72 is dried. The method used for drying the coating composition is not particularly limited, and any method may be selected from those known in the art depending on the speed at which the substrate B is conveyed as long as the coating composition can be dried before the substrate B reaches the UV irradiator 42. Exemplary drying methods include heating with a heater and heating with hot air.

The substrate B is then conveyed to the UV irradiator 42, where the coating composition having been applied by the coater means 72 and dried by the dryer means 74 is irradiated with UV light as in the embodiments described above to polymerize the monomer to thereby form the organic film 12.

Next, the substrate roll 76 which is a roll of the substrate B having the organic film 12 formed thereon is loaded in an inorganic film formation device 80 as schematically shown in FIG. 3B.

More specifically, in the inorganic film formation device 80, the substrate roll 76 which is a roll of the substrate B having the organic film 12 formed thereon is loaded on a rotary shaft 68 for use in feeding the substrate B to an inorganic film forming chamber 28, and the rotary shaft 68 is rotated to feed the substrate B having the organic film 12 formed thereon from the substrate roll 76 to an inorganic film forming chamber 28 as it is guided by a guide roll 69 which is in contact with the rear surface (the surface on which the organic film 12 is not formed) of the substrate B. As above, the inorganic film 14 is formed on the substrate B to produce the functional film 10, which is then wound into a roll.

In the inorganic film formation device 80, a means for feeding the substrate B and a means for winding the functional film are placed in a feed and take-up chamber which communicates with the inorganic film forming chamber 28 as is seen from FIG. 3B showing a part of a wall 82. This feed and take-up chamber is a vacuum chamber, which is evacuated to a predetermined pressure by a vacuum evacuation means (not shown) to prevent the pressure in the feed and take-up chamber from adversely affecting the formation of the inorganic film 14.

While the method for producing a functional film according to the present invention has been described above in detail, the present invention is by no means limited to the foregoing embodiments and it should be understood that various improvements and modifications may of course be made without departing from the scope and spirit of the invention.

EXAMPLES

Next, the present invention is described in further detail by referring to the Examples.

Example

Example 1

A mixture solution containing a mixture of 15 g of a polymerizable monomer BEPGA available from Kyoeisha Chemical Co., Ltd. and 5 g of a polymerizable monomer V-3PA available from Osaka Organic Chemical Industry Ltd., 1.5 g of a UV polymerization initiator (trade name: Esacure KTO-46 available from Lamberti S.p.A.), and 190 g of 2-butanone was prepared, and used as a coating composition for the formation of the organic film 12.

This coating composition was applied on the surface of a PET film (polyethylene terephthalate film) with a wire bar to a coating thickness of 5 μm.

After drying the coating at room temperature for 2 hours, the monomer mixture was polymerized by irradiating the coating with UV light from a high pressure mercury vapor lamp to an accumulated irradiation energy of about 2 J/cm$^2$ in a chamber where the oxygen concentration had been adjusted to 0.1% by nitrogen flushing. An organic film 12 having a thickness of 500 nm±50 nm was thereby formed.

A sputtering device was used to form on the organic film 12 an aluminum oxide film with a thickness of 40 nm serving as the inorganic film 14 to thereby produce a gas barrier film.

In forming the aluminum oxide film, use was made of aluminium as a target, argon as a discharge gas, and oxygen as a reactive gas, respectively. The pressure in film formation was set to 0.1 Pa.

Comparative Example 1

A gas barrier film was formed by repeating the procedure of Example 1 except that, before forming the inorganic film 14 (aluminum oxide film), the PET film having the organic film 12 formed thereon was passed once in the vacuum chamber through a pair of conveyor rollers under a reduced pressure of 0.1 Pa which is the pressure used in forming the inorganic film 14.

The surface of the organic film 12 that had been once passed through the pair of conveyor rollers was observed by an electron microscope and was found to have countless minute irregularities.

The gas barrier films produced in Example 1 and Comparative Example 1 were evaluated for their water vapor transmission rate at a temperature of 40° C. and a relative humidity of 90% by using a water vapor transmission rate tester (PERMATRAN-W3/31 available from Mocon, Inc.).

Since the detection limit in the method of measuring the water vapor transmission rate is $1 \times 10^{-2}$ g/m$^2$/day, the sample in which the water vapor transmission rate according to this measurement method was below the detection limit was then subjected to measurement of the water vapor transmission rate at a temperature of 40° C. and a relative humidity of 90% according to the method described in the following reference:

G. NISATO, P.C.P. BOUTEN, P. J. SLIKKERVEER et al. SID Conference Record of the International Display Research Conference, pages 1435-1438.

As a result, the water vapor transmission rate in Example 1 was $1.1 \times 10^{-3}$ g/m²/day whereas the water vapor transmission rate in Comparative Example 1 was $3.4 \times 10^{-2}$ g/m²/day.

Reference Example 1

When a gas barrier film was prepared by repeating the procedure of Example 1 except that the PET film having the organic film 12 formed thereon was passed once through the pair of conveyor rollers as in Comparative Example 1 but at atmospheric pressure, the results obtained were substantially the same as those in Example 1.

The results as described above demonstrate the merits of the present invention.

What is claimed is:

1. A method for producing a functional film comprising the steps of:
    forming an organic film on a surface of a substrate;
    handling the substrate having the organic film formed on the surface of the substrate so that no member comes in contact with an organic film surface in vacuum until formation of an inorganic film; and
    forming the inorganic film by vacuum deposition on the organic film surface to produce the functional film,
    wherein the organic film is formed in an organic film forming chamber, and the inorganic film is formed in an inorganic film forming chamber which is adjacent to and substantially airtightly separated from the organic film forming chamber, the inorganic film forming chamber being evacuated by vacuum evacuation means to a degree of vacuum adequate for the formation of the inorganic film by vacuum deposition, the substrate having the organic film formed on its surface being conveyed from organic film forming chamber into the inorganic film forming chamber through a slit formed in a separation wall without contacting the separation wall,
    the organic film is prepared by polymerizing a monomer mixture comprising a monomer represented by the following formula wherein the index n is 2 and a monomer represented by the formula wherein the index n is at least 3:

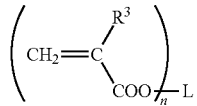

wherein $R^3$ represents a hydrogen atom or a methyl group, the $R^3$ groups in the formula being the same or different and L represents an n-valent linking group.

2. The functional film production method according to claim 1, wherein the inorganic film formed has gas barrier properties.

3. The functional film production method according to claim 1, wherein the organic film and the inorganic film are formed on a long strip of the substrate, the inorganic film is formed on the organic film surface while the substrate having the organic film formed on the surface of the substrate is guided on a drum and conveyed in its longitudinal direction.

4. The functional film production method according to claim 1, wherein a long strip of the substrate is conveyed along a predetermined pathway on which a means for forming the organic film and a means for forming the inorganic film are provided, and the organic film and the inorganic film are formed while the substrate is conveyed in its longitudinal direction.

5. The functional film production method according to claim 1, wherein the organic film is formed by polymerizing the monomer mixture containing the monomer represented by the formula wherein the index n is 2 and a monomer represented by the formula wherein the index n is 3.

6. The functional film production method according to claim 5, wherein when only the monomer wherein the index n is 2 and the monomer wherein the index n is 3 are used for the monomer mixture as the monomer components represented by the formula in the formation of the organic film, the monomer wherein the index n is 2 is used at a mixing ratio of 60 to 80 % by weight and the monomer wherein the index n is 3 is used at a mixing ratio of 20 to 40 % by weight.

7. The functional film production method according to claim 1, wherein the organic film is formed by polymerizing the monomer mixture containing the monomer represented by the formula wherein the index n is 2 and a monomer represented by the formula wherein the index n is at least 4.

8. The functional film production method according to claim 7, wherein when only the monomer wherein the index n is 2 and the monomer wherein the index n is at least 4 are used for the monomer mixture as the monomer components represented by the formula in the formation of the organic film, the monomer wherein the index n is 2 is used at a mixing ratio of 75 to 95 % by weight and the monomer wherein the index n is at least 4 is used at a mixing ratio of 5 to 25 % by weight.

9. The functional film production method according to claim 1, wherein the monomer represented by the formula wherein the index n is 2 and the monomer represented by the formula wherein the index n is at least 3 each has a molecular weight exceeding 700.

* * * * *